US007851757B2

(12) United States Patent
Nagayama (10) Patent No.: US 7,851,757 B2
(45) Date of Patent: Dec. 14, 2010

(54) PHASE PLATE FOR ELECTRON MICROSCOPE AND METHOD FOR MANUFACTURING SAME (75) Inventor: Kuniaki Nagayama, Aichi (JP)

(73) Assignee: Nagayama IP Holdings, LLC, New York, NY (US)

( * ) Notice: Subject to any disclaimer, the term of this patent is extended or adjusted under 35 U.S.C. 154(b) by 131 days.

(21) Appl. No.: 12/084,478

(22) PCT Filed: Nov. 1, 2006

(86) PCT No.: PCT/JP2006/321910

§ 371 (c)(1),
(2), (4) Date: Sep. 5, 2008

(87) PCT Pub. No.: WO2007/052723

PCT Pub. Date: May 10, 2007

(65) Prior Publication Data
US 2009/0168142 A1    Jul. 2, 2009

(30) Foreign Application Priority Data
Nov. 4, 2005    (JP) ............................. 2005-321402
Sep. 6, 2006    (JP) ............................. 2006-242094

(51) Int. Cl.
G01N 23/00    (2006.01)
(52) U.S. Cl. ...................................... 250/311; 250/306
(58) Field of Classification Search ................. None
See application file for complete search history.

(56) References Cited
U.S. PATENT DOCUMENTS 4,935,625 A * 6/1990 Hasegawa et al. ............... 850/9
5,814,815 A * 9/1998 Matsumoto et al. ......... 250/311
5,834,803 A * 11/1998 Nashimoto .................. 257/295
6,674,078 B2 * 1/2004 Nagayama et al. .......... 250/311
2002/0011566 A1 * 1/2002 Nagayama et al. .......... 250/311
2002/0086317 A1 * 7/2002 Nagayama ..................... 435/6

(Continued)

FOREIGN PATENT DOCUMENTS
DE    1 052 965    2/1957

(Continued)

OTHER PUBLICATIONS
International Search Report mailed Feb. 13, 2007 for International Application No. PCT/JP2006/321910.

Primary Examiner—Bernard E Souw
Assistant Examiner—Andrew Smyth
(74) Attorney, Agent, or Firm—Wenderoth, Lind & Ponack, L.L.P.

(57) ABSTRACT

A phase plate for an electron microscope in which a portion of a magnetic thin-wire ring or a magnetic thin-wire rod spans an opening of a support member having the opening, the magnetic thin-wire ring or magnetic thin-wire rod generates a vector potential, and a phase difference is formed between electron beams that pass through left and right sides of a spanning portion of the magnetic thin-wire ring or the magnetic thin-wire rod. The phase plate prevents the electron beam loss more effectively, can be applied at an accelerating voltage within a wide rage from a low voltage to a high voltage, causes no difficulties in production, has good utility, and makes it possible to obtain a high-contrast image.

5 Claims, 10 Drawing Sheets

U.S. PATENT DOCUMENTS

| | | | |
|---|---|---|---|
| 2003/0066964 A1* | 4/2003 | Nagayama et al. | 250/311 |
| 2004/0234861 A1* | 11/2004 | Kawase et al. | 429/245 |
| 2005/0119850 A1* | 6/2005 | Asano | 702/108 |
| 2008/0035854 A1* | 2/2008 | Jin et al. | 250/396 R |

FOREIGN PATENT DOCUMENTS

| | | | |
|---|---|---|---|
| JP | 60-007048 | | 1/1985 |
| JP | 64-65762 | | 3/1989 |
| JP | 06-333529 | | 12/1994 |
| JP | 06333529 | A * | 12/1994 |
| JP | 09-237603 | | 9/1997 |
| JP | 2001-273866 | | 10/2001 |
| JP | 2003-100249 | | 4/2003 |
| JP | 2006162805 | A * | 6/2006 |

* cited by examiner

PHASE PLATE FOR ELECTRON MICROSCOPE AND METHOD FOR MANUFACTURING SAME

TECHNICAL FIELD

The present invention relates to a phase plate for an electron microscope and to a method for manufacturing the phase plate. More particularly, the present invention relates to a novel phase plate for an electron microscope that prevents electron beam loss and to a method for manufacturing the phase plate.

BACKGROUND ART

An internal electric potential of a substance has been used as a source of phase change in phase plates of electron microscopes. However, when electrons pass through a substance, electron scattering occurs, causing an electron beam loss in image formation and deterioration of image intensity. To alleviate this effect, using a light element (for example, carbon) as a phase plate has been suggested (Japanese Patent Applications Laid-open Nos. 2001-273866 and 2003-100249). However, this suggestion also failed to prevent the occurrence of electron beam loss and lacked utility at an accelerating voltage of 100 kV or less. It was also suggested to prevent the electron beam loss by producing spatially an electrostatic potential (Japanese Patent Application Laid-open No. 9-237603, German Patent Application Laid-open No. 01052965) or a vector potential (Japanese Patent Application Laid-open No. S60-7048) and preventing the loss caused by substance scattering, but these methods have not yet reached the stage of practical use due to difficulties associated with the production process.

SUMMARY OF THE INVENTION

The present invention has been accomplished with consideration for the above-described situation of the above prior art, and it is an object of the present invention to provide a phase plate for an electron microscope that can prevent the electron beam loss more effectively, can be employed at an accelerating voltage within a wide range from a low voltage to a high voltage, causes no difficulties in production, has good utility, and makes it possible to obtain high-contrast images, and also to provide a method for manufacturing such a phase plate.

In accordance with the present invention, in order to solve the above-described problems, 1) there is provided a phase plate for an electron microscope in which a portion of a magnetic thin-wire ring or a magnetic thin-wire rod spans an opening of a support member having the opening, the magnetic thin-wire ring or magnetic thin-wire rod generates a vector potential, and a phase difference is formed between electron beams that pass through left and right sides of a spanning portion of the magnetic thin-wire ring or the magnetic thin-wire rod.

2) There is provided the phase plate for an electron microscope according to the first embodiment, wherein the phase difference between the electron beams that pass through left and right sides of the spanning magnetic thin-wire is controlled to a specific value by adjusting a value of a cross-section of the magnetic thin-wire.

3) There is provided the phase plate for an electron microscope according to the first embodiment, wherein the phase difference between the electron beams that pass through left and right sides of the spanning magnetic thin-wire is controlled to a specific value by adjusting a value of saturation magnetization of the magnetic thin-wire.

4) There is provided the phase plate for an electron microscope according to the third embodiment, wherein the adjustment of saturation magnetization of the magnetic thin-wire is performed by temperature control.

5) There is provided the phase plate for an electron microscope according to any one of the second to fourth embodiments, wherein the value of the phase difference is $\pi$.

6) There is provided the phase plate for an electron microscope according to any one of the first to fifth embodiments, wherein the magnetic thin-wire ring is formed from Permalloy.

7) There is provided the phase plate for an electron microscope according to any one of the first to sixth embodiments, wherein a planar shape of the magnetic thin-wire ring is a rectangular shape.

8) There is provided the phase plate for an electron microscope according to any one of the first to sixth embodiments, wherein a planar shape of the magnetic thin-wire ring is a semicircular shape.

9) There is provided the phase plate for an electron microscope according to any one of the first to fifth embodiments, wherein the magnetic thin-wire rod is made of a permanent magnet having high coercivity.

10) There is provided the phase plate for an electron microscope according to any one of the first to ninth embodiments, wherein the support member is a nonmagnetic oxidation-resistant conductive thin film such as a carbon thin film or a noble metal thin film.

11) There is provided the phase plate for an electron microscope according to any one of the first to ninth embodiments, wherein the support member is a thin laminating film of a silicon thin film and a nonmagnetic oxidation-resistant conductive thin film such as a carbon thin film or a noble metal thin film.

12) There is provided a method for manufacturing a phase plate for an electron microscope in which a portion of a magnetic thin-wire ring spans an opening of a support member having the opening, the magnetic thin-wire ring generates a vector potential, and a phase difference is formed between electron beams that pass through left and right sides of a spanning portion of the magnetic thin-wire ring, the method comprising the following steps relating to the fabrication of the magnetic thin-wire ring:

(a1) a step of forming a carbon thin film on a base material such as mica;

(b1) a step of forming a silicon thin film on the carbon thin film;

(c1) a step of forming a resist film on the silicon thin film;

(d1) a step of forming a plurality of ring-shaped grooves by an electron beam lithography method or a focused ion beam method on the resist film and removing the resist to obtain a ring-like shape;

(e1) a step of depositing a magnetic film on the entire resist film having a plurality of ring-shaped grooves;

(f1) a step of leaving a plurality of magnetic rings and removing the unnecessary resist film together with the magnetic film;

(g1) a step of peeling off a structural body comprising the carbon silicon composite thin film and a plurality of magnetic rings located thereon from the base material by water surface peeling;

(h1) a step of picking up the structural body with a grid for an electron microscope; and (i1) a step forming a magnetic thin-wire ring having an orifice for passing an electron beam therethrough by processing a specific magnetic piece of the structural body located on the grid for an electron microscope by using a focused ion beam method.

13) There is provided a method for manufacturing a phase plate for an electron microscope in which a portion of a magnetic thin-wire ring spans an opening of a support member having the opening, the magnetic thin-wire ring generates a vector potential, and a phase difference is formed between electron beams that pass through left and right sides of a spanning portion of the magnetic thin-wire ring, the method comprising the following steps relating to the fabrication of the magnetic thin-wire ring:

(a2) a step of forming a silica ($SiO_2$) film on a base material such as silicon;

(b2) a step of forming a noble metal thin film or a carbon thin film on the silica thin film;

(c2) a step of forming a resist film on the noble metal thin film or carbon thin film;

(d2) a step of forming a plurality of ring-shaped grooves by an electron beam lithography method or a focused ion beam method on the resist film and removing the resist to obtain a ring-like shape;

(e2) a step of depositing a magnetic film on the entire resist film having a plurality of ring-shaped grooves;

(f2) a step of leaving a plurality of magnetic rings and removing the resist film together with the magnetic film;

(g2) a step of forming a carbon thin film as a protective film of a plurality of magnetic rings that embeds the rings;

(h2) a step of peeling off a structural body comprising the composite carbon silicon-composite thin film and a plurality of magnetic rings embedded therein from the base material by immersion in a hydrogen fluoride solution and silica layer elution peeling;

(i2) a step of scooping up the structural body with a grid for an electron microscope; and (j2) a step forming a magnetic thin-wire ring having an orifice for passing an electron beam therethrough by processing a specific magnetic piece of the structural body located on the grid for an electron microscope by using a focused ion beam method.

14) There is provided a method for manufacturing a phase plate for an electron microscope in which a magnetic thin-wire rod spans an opening of a support member having the opening, the magnetic thin-wire rod generates a vector potential, and a phase difference is formed between electron beams that pass through left and right sides of the magnetic thin-wire rod, the method comprising the following steps relating to the fabrication of the magnetic thin-wire rod:

(a3) a step of preparing a metal thin-wire having a diameter of 50 nm to 1 μm and having a length of 10 to 1000 μm;

(b3) a step of causing the metal thin-wire to span the opening of the support member by operations under a stereomicroscope;

(c3) a step of fixing both ends of the spanned metal thin-wire on the side of the support member to the support member; and (d3) a step of vapor depositing a magnetic material with high coercivity on the metal thin-wire having both ends thereof fixed, while controlling a thickness, and forming a magnetic thin film.

15) There is provided a method for manufacturing a phase plate for an electron microscope in which a magnetic thin-wire rod spans an opening of a support member having the opening, the magnetic thin-wire rod generates a vector potential, and a phase difference is formed between electron beams that pass through left and right sides of the magnetic thin-wire rod, the method comprising the following steps relating to the fabrication of the magnetic thin-wire rod:

(a4) a step of isolating a biologically derived filamentary polymerized protein having a diameter of 10 nm to 1 μm;

(b4) a step of reconfiguring and adjusting the isolated filamentary polymerized protein and preparing an aqueous solution sample containing a filamentary protein with a length of 10 to 1000 μm;

(c4) a step of placing a drop of suspension of the filamentary polymerized protein on a mesh-like support member having a large number of openings and sucking up with a filtration paper to produce a water flow;

(d4) a step of confirming under a low-temperature electron microscope that the filamentary polymerized protein arranged in one direction by the flow spans the openings of the support;

(e4) a step of freeze drying the support spanned by the confirmed filamentary polymerized protein;

(f4) a step of removing those of a large number of spanned filamentary polymerized proteins that will not be used as a base for a magnetic thin-wire by using a focused ion beam method; and (g4) a step of vapor depositing a magnetic material with high coercivity on the support where the filamentary polymerized protein has been spanned and also on the filamentary polymerized protein, while controlling a thickness, and forming a magnetic thin film.

16) There is provided a method for manufacturing a phase plate for an electron microscope in which a magnetic thin-wire spans an opening of a support member having the opening, the magnetic thin-wire rod generates a vector potential, and a phase difference is formed between electron beams that pass through left and right sides of the magnetic thin-wire rod, the method comprising the following steps relating to the fabrication of the magnetic thin-wire rod:

(a5) a step of preparing dispersible carbon nanotubes having a diameter of 10 nm to 1 μm and having dispersibility in water;

(b5) a step of adjusting isolated dispersible carbon nanotubes and preparing an aqueous solution containing dispersible carbon nanotubes with a length of 10 to 1000 μm;

(c5) a step of placing a drop of the aqueous solution containing dispersible carbon nanotubes on a mesh-like support member having a large number of openings and sucking up with a filtration paper to produce a water flow;

(d5) a step of confirming under a microscope that the dispersible carbon nanotubes arranged in one direction by the flow span the openings of the support;

(e5) a step of drying the support with a large number of confirmed dispersible carbon nanotubes;

(f5) a step of removing those of a large number of spanned dispersible carbon nanotubes that will not be used as a base for a magnetic thin-wire by using a focused ion beam method; and (g5) a step of vapor depositing a magnetic material with high coercivity on the support where the dispersible carbon nanotubes have been spanned and also on the dispersible carbon nanotubes, while controlling a thickness, and forming a magnetic thin film.

17) There is provided the method for manufacturing a phase plate for an electron microscope according to any one of the twelfth to sixteenth inventions, wherein after all the steps have been completed, both surfaces of the phase plate are coated with a nonmagnetic oxidation-resistant conductive thin film, such as a carbon thin film or a noble metal thin film, in order to prevent charging induced by electron beams.

According to the present invention, phase control of electron beam is performed using a vector potential. Therefore, it is possible to provide a phase plate for an electron microscope in which there is practically no substance shielding the electron beam, that can prevent the electron beam loss with better efficiency, can be employed at an accelerating voltage within a wide range from a low voltage to a high voltage, and makes it possible to obtain a high-contrast image, and also to provide a method for manufacturing the phase plate.

DETAILED DESCRIPTION OF THE INVENTION

The present invention has the above-described features, and the embodiments thereof will be explained below.

In the phase plate for an electron microscope of the present invention, a portion of a magnetic thin-wire ring or a magnetic thin-wire rod is caused to span an opening of a support member having the opening, the magnetic thin-wire ring or magnetic thin-wire rod generates a vector potential, and a phase difference is formed between electron beams that will pass on both sides of a spanning portion of the magnetic thin-wire ring or the magnetic thin-wire rod.

In the conventional phase plate, for example, such as described in Japanese Patent Application Laid-open No. 2003-100249 a phase shift is used that is created by an internal electrostatic potential produced by a substance, but in the phase plate of the present invention, a phase shift of an electron wave created by a vector potential is used. As a result, in the phase plate of the present invention, a magnetic flux producing a vector potential is created. This magnetic flux is realized as a flux confined in the longitudinal axis direction within the magnetic thin-wire having a high magnetic permeability.

Various magnetic materials can be used as a magnetic material for generating the magnetic flux, provided that they have a high magnetic permeability, but a Permalloy having soft magnetic properties is used for the closed circuit of the magnetic thin-wire ring, and a permanent magnet with high coercivity is used for the magnetic thin-wire rod. The magnetic flux is generated in the longitudinal direction of the magnetic thin-wire, but in the case of the closed circuit of Permalloy ring, forced magnetization by the external magnetic field is difficult and, therefore, spontaneous magnetization is used. In the magnetic thin-wire rod, a method for magnetizing with a strong external magnetic field is applied. The size of magnetic flux determines the size of vector potential and, therefore, the phase difference. The size of magnetic flux is controlled by controlling the cross-section of the magnetic thin-wire and saturation magnetization of the magnetic material.

A nonmagnetic stable thin film, for example, a carbon thin film, a silicon thin film, a noble metal thin film, or laminated films thereof can be used as the support member. The film thickness of the support member is about 100 nm to 100 μm.

In the phase plate of the present invention, the phase difference between the electron beams passing on both, left and right, sides of the magnetic thin-wire can be controlled to a specific value by adjusting the size of the cross-section of the magnetic thin-wire. For example, with a ferromagnetic material such as Permalloy and cobalt, the phase difference becomes $\pi$ at a cross-section of 2,000 nm$^2$ at a temperature close to room temperature. In the case the phase difference is made $\pi$, a phase plate based on the Hilbert differential contrast method is obtained.

The phase difference created by the phase plate can be controlled to a specific value by adjusting not only the cross-section, but also the saturation magnetization of the magnetic thin-wire. In this case, the adjustment of the saturation magnetization of the magnetic thin-wire can be performed by temperature control that uses a Curie law.

Figure 1:
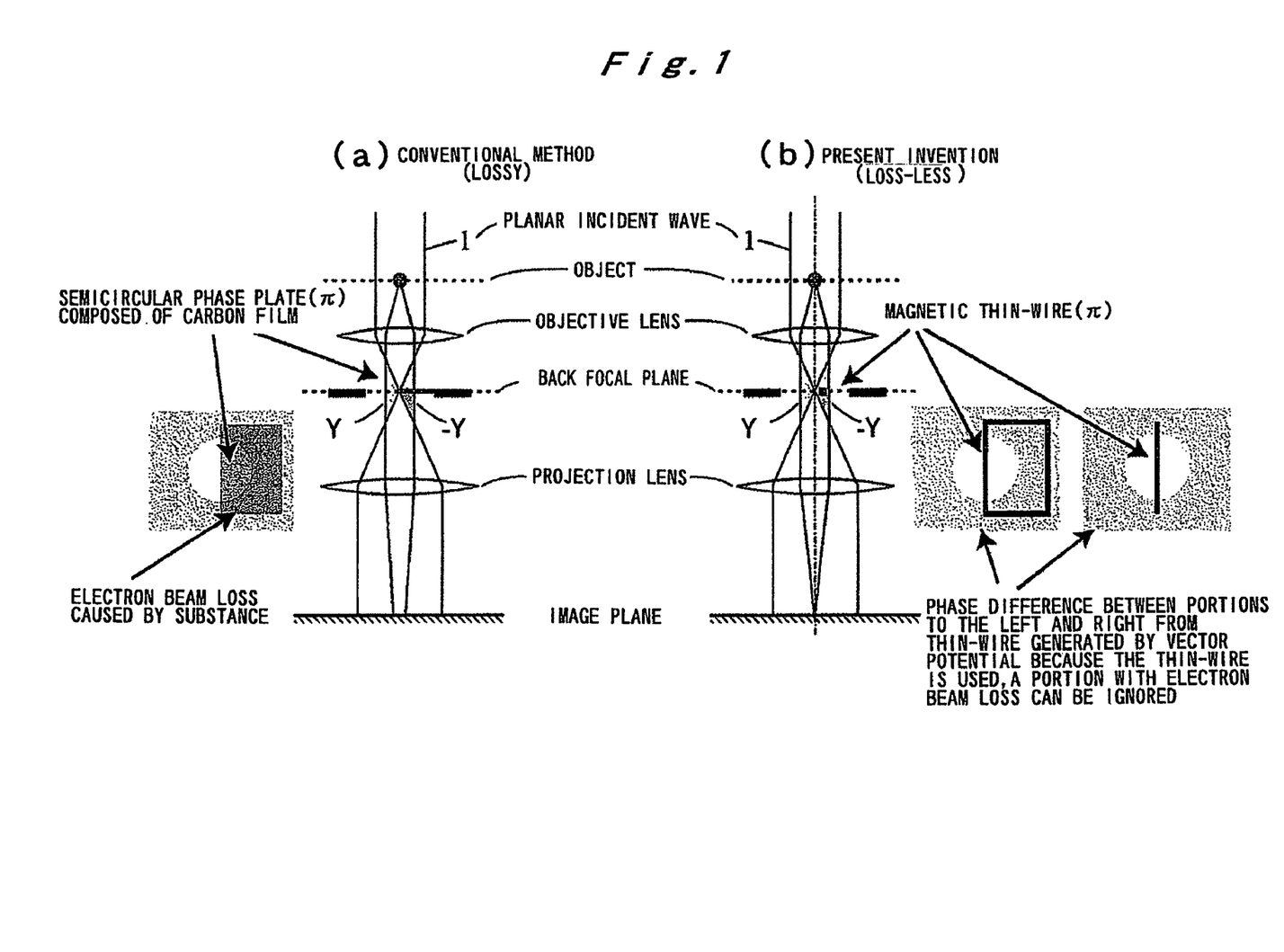
FIG. 1 illustrates the concept of the loss-less phase contrast method (b) using the phase plate of the present invention in comparison with the lossy phase contrast method (a) described in Japanese Patent Application Laid-open No. 2003-100249.

Here, the general concept of the loss-less phase contrast method using the phase plate of the present invention is shown in FIG. 1 in comparison with the lossy phase contrast method using a carbon film that is described in Japanese Patent Application Laid-open No. 2003-100249. FIG. 1(a) is a general concept drawing of the lossy phase contrast method and (b) is a general concept drawing of the loss-less phase contrast method.

The conventional lossy phase contrast method shown in FIG. 1(a) is a phase contrast method using a carbon film phase plate providing a phase variation of $\pi$ (phase delay by half a wavelength) and is equivalent to a differential interferometry method in an optical microscope. A phase plate is formed by providing a carbon film so as to cover about half of a circular opening on a support member having the circular opening (aperture orifice), and the thickness of the carbon film is varied correspondingly to the accelerating voltage to provide a phase shift of $\pi$. For example, when this method is applied to an electron microscope with an accelerating voltage of 300 kV, a carbon thin film with a thickness of about 60 nm is provided to cover half of the aperture orifice. However, with such configuration, loss induced by scattering occurs when an electron beam passes through the carbon film, the image intensity is attenuated by about half, and there is room for improvement.

FIG. 1(b) illustrates a loss-less phase contrast method according to the present invention that uses a magnetic thin-wire to produce a phase difference in order to solve the above problem. The magnetic thin-wire is formed to span a support member having an opening (aperture orifice). The structure of the phase plate used in the loss-less phase contrast method will be described below in more detail.

First, a vector potential used in the present invention will be described. A phase shift of an electron wave created by a vector potential is known as an Aharonov—Bohm effect (referred to hereinbelow as AB effect) and it was theoretically predicted by Y. Aharonov and D. Bohm in 1959. The complete verification thereof was reported by Akira Tonomura (Hitachi, Ltd.) in 1980s by using an electron beam holography. An idea of a phase plate for an electron microscope using this effect was described in a patent application for a Zernike phase plate in 1985, but was not granted a patent (S. Kasai et al., "Aharonov-Bohm Oscillation of resistance observed in a ferromagnetic Fe—Ni nanoring", Appl. Phys. Lett. 81 (2002) 316-318). This is apparently because the design of the Zernike phase plate made the production difficult. With the present invention, such problems associated with production are solved by using a design of the Hilbert differential contrast phase plate.

Figure 2:
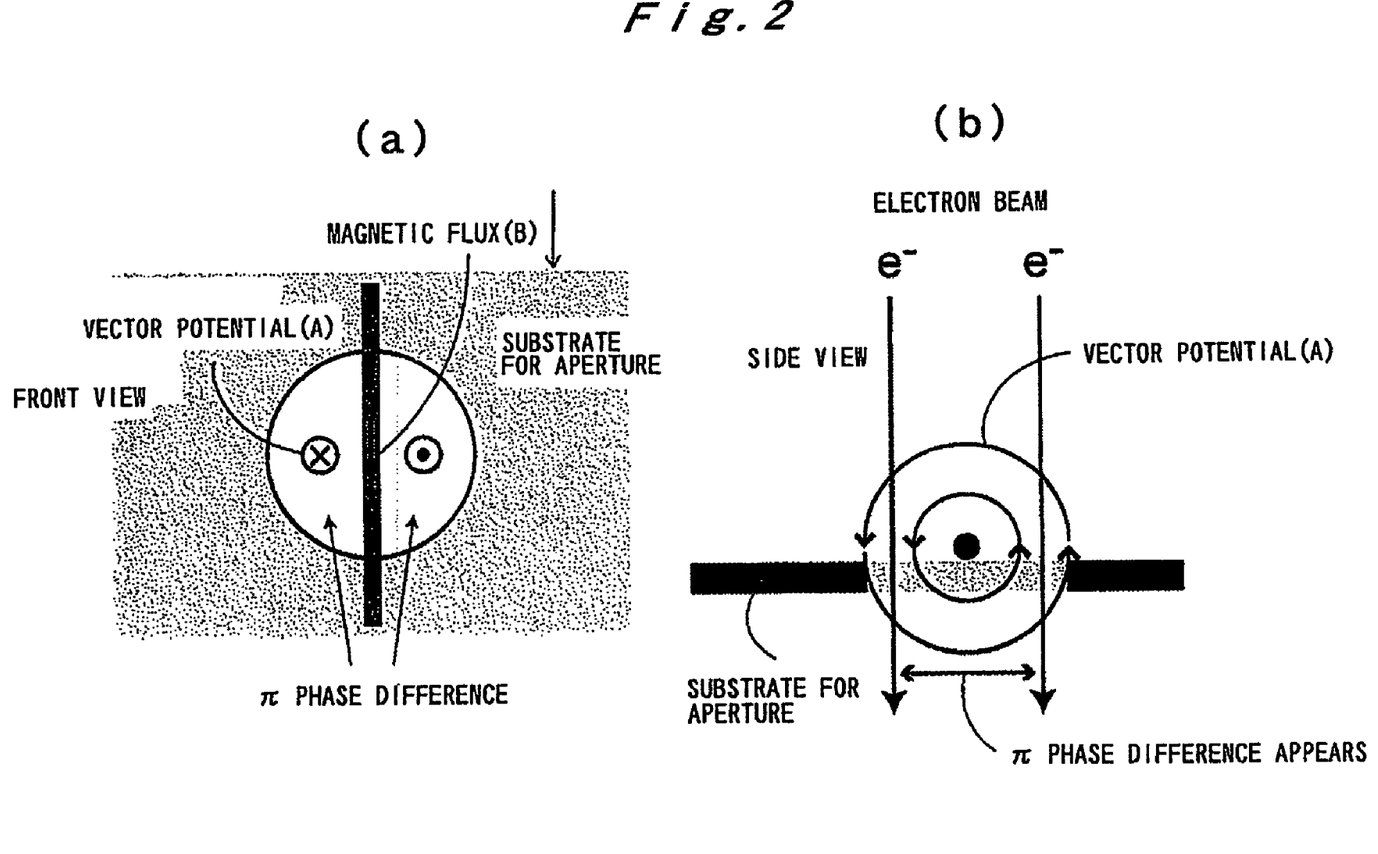
FIG. 2 is an explanatory drawing illustrating the AB effect produced by the vector potential created by the magnetic flux of the magnetic thin-wire.

FIG. 2 is an explanatory drawing illustrating the AB effect produced by a magnetic thin-wire rod; (a) is a front view and (b) is a side view. In the figure, A is vector potential and B is magnetic flux.

As shown in FIG. 2, the effect on the electron wave on the two, left and right, sides of the magnetic thin-wire differs depending on the vector potential A produced by the magnetic flux. This difference is demonstrated as a shift $\Delta\theta$ of the electron wave phase. The shift phase difference $\Delta\theta$ of the left and right phase is constant in the vicinity of the magnetic thin-wire. FIG. 2(b) shows a closed-loop ring-like and rod-like magnetic thin-wires. A specific feature of the closed loop in which the magnetic flux is confined is that the phase difference between the inside and outside regions is constant, regardless of location. By contrast, in the rod-like magnetic material, the phase difference becomes constant only close to the rod center because of the magnetic flux leak. In particular, in the region where the magnetic flux leak from the magnetic thin-wire can be ignored, this difference can be given by the following Equation (1).

$$\Delta\theta = \theta_{in} - \theta_{out} = \frac{e}{\hbar}\oint A(x) \cdot dx = \frac{e}{\hbar}\int B(r) \cdot n dS = \frac{e}{\hbar}\Phi_{total} \quad \text{[Equation 1]}$$

(e: elementary electric charge, h: Planck's constant, A(x): vector potential, B(r): magnetic flux density, $\Phi_{total}$: total magnetic flux).

By using a magnetic thin-wire ring with an outer diameter of several microns, Tonomura ascertained that the phase $\theta_{in}$ on the inner side of the ring and the phase $\theta_{out}$ on the outer side are uniform and the difference $\Delta\theta$ thereof is proportional to the magnetic flux $\Phi_{total}$ that is the integral of the magnetic flux density B.

The AB effect shown in FIG. 2 is ideal for a phase plate in an electron microscope. Because phase variation is performed by a vector potential that spreads in a free space, no electron beam loss occurs when an electron beam passes through an object. The phase difference between zones on the left and right sides of the magnetic thin-wire does not depend on the accelerating voltage of electron beam and depends only on the size of magnetic flux confined by the magnetic material. Further, because the magnetic flux $\Phi_{total}$ that is necessary to produce a $\pi$ phase is extremely small, the magnetic thin-wire can have an extremely small diameter, the size thereof in reality can be ignored, and no obstacle is created for the electron beam. Further, the entire support member, including the magnetic thin-wire, is easy to cover with an electrically conductive substance, thereby avoiding the problem of electrostatically charging the phase plate.

The AB effect verification experiment using a magnetic thin-wire ring that was performed by Tonomura could be immediately applied to a Zernike phase contrast method using a small central orifice (German Patent Application Laid-open No. 01052965), but with this method, an ultrasmall ring was difficult to produce in the center of an opening, similarly to the technology of the production method described in Japanese Patent Application Laid-open No. H9-237603. Because of such difficulty in production, only a comparatively large ring could be produced and the effectiveness of the phase contrast method was doubtful.

Accordingly, the inventors of the present invention decided to produce a phase plate of a simple structure such as shown in FIG. 1(b). This phase plate is based on the Hilbert differential contrast method demonstrating the same effect as the Zernike phase contrast method and is realized with a magnetic thin-wire. This phase plate is shown in detail in FIG. 3.

Figure 3:
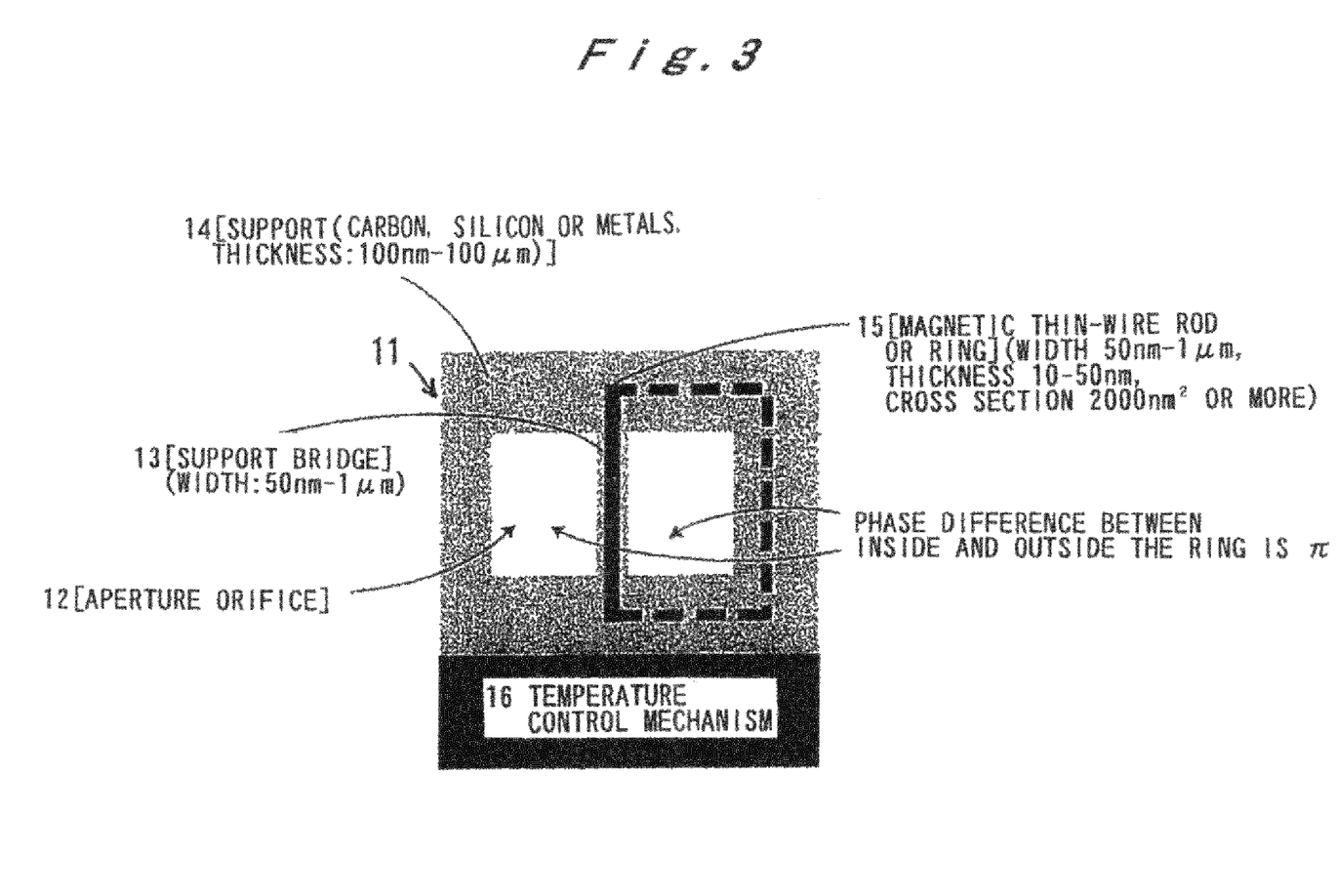
FIG. 3 illustrates in details the structure example of the phase plate (AB phase plate) of the present invention.

As shown in FIG. 3, the phase plate (11) has a structure in which a ring-shaped or rod-shaped magnetic thin-wire (15) is provided on a support member (14) having an aperture orifice (12) and has a support bridge (13) formed thereon. Reference numeral (16) stands for a temperature control mechanism. The magnetic thin-wire (15) has a width of about 50 nm to 1 μm, a thickness of about 10 to 50 nm, and a cross-section of 2,000 nm² or more, the upper limit thereof being about 5,000 nm².

For example, when Permalloy is used as the magnetic material (15), because the saturation magnetization of Permalloy is about 1 Wb/m² at normal temperature, the cross-section can be estimated, as described below, from Equation (1) as about 2,000 nm² in the case of a π shift. Here, S is a cross-sectional area of the magnetic thin-wire and $B_s$, is a magnetic flux density determined by saturation magnetization.

$$\pi = \frac{e}{\hbar}\Phi = 2\pi\frac{e}{\hbar}B_s \cdot S, B_s \cong 1 \text{ Wb/m}^{-2} \quad \text{[Equation 2]}$$

$$S = \frac{1}{2}\frac{\hbar}{eB_s} \quad \text{[Equation 3]}$$

$$\cong \frac{1}{2} \times 4 \times 10^{-15} \text{ Wb/1 Wb m}^{-2}$$

$$= 2 \times 10^{-15} \text{ m}^2$$

$$= 2,000 \text{ nm}^2$$

In actual production of the magnetic thin-wire ring, it is possible not to set the cross-section strictly to 2,000 nm² and to produce a somewhat larger ring. This is because where the mechanism (16) that fixes the phase plate (11) and maintains it at a high temperature (about 300 to 1200° C.) is provided, the saturation magnetization can be set to any value less than 1 Wb/m² by using a Curie law. Conversely, the adjustment to a precise π shift can be performed by an appropriate temperature setting. A temperature-controlled stage for an electron microscope that has already been commercialized can be used as the temperature controlling mechanism (16).

A method for processing the magnetic thin-wire ring and transferring it onto a support member will be described below.

A heretofore reported method (S. Kasai et al., "Aharonov-Bohm Oscillation of resistance observed in a ferromagnetic Fe—Ni nanoring", Appl. Phys. Lett. 81 (2002) 316-318) can be used to produce a magnetic ring using Permalloy. However, due to a structural specificity of the magnetic thin-wire ring in the phase plate according to the present invention, a novel approach to the production process is needed. This is because the magnetic thin-wire ring is of a nanometer size and, therefore, can be easily fractured, thereby making it impossible to peel off the ring from above the silicon wafer and transfer the ring onto the aperture orifice. In the present invention, the following two methods are proposed to solve this problem.

Figure 4:
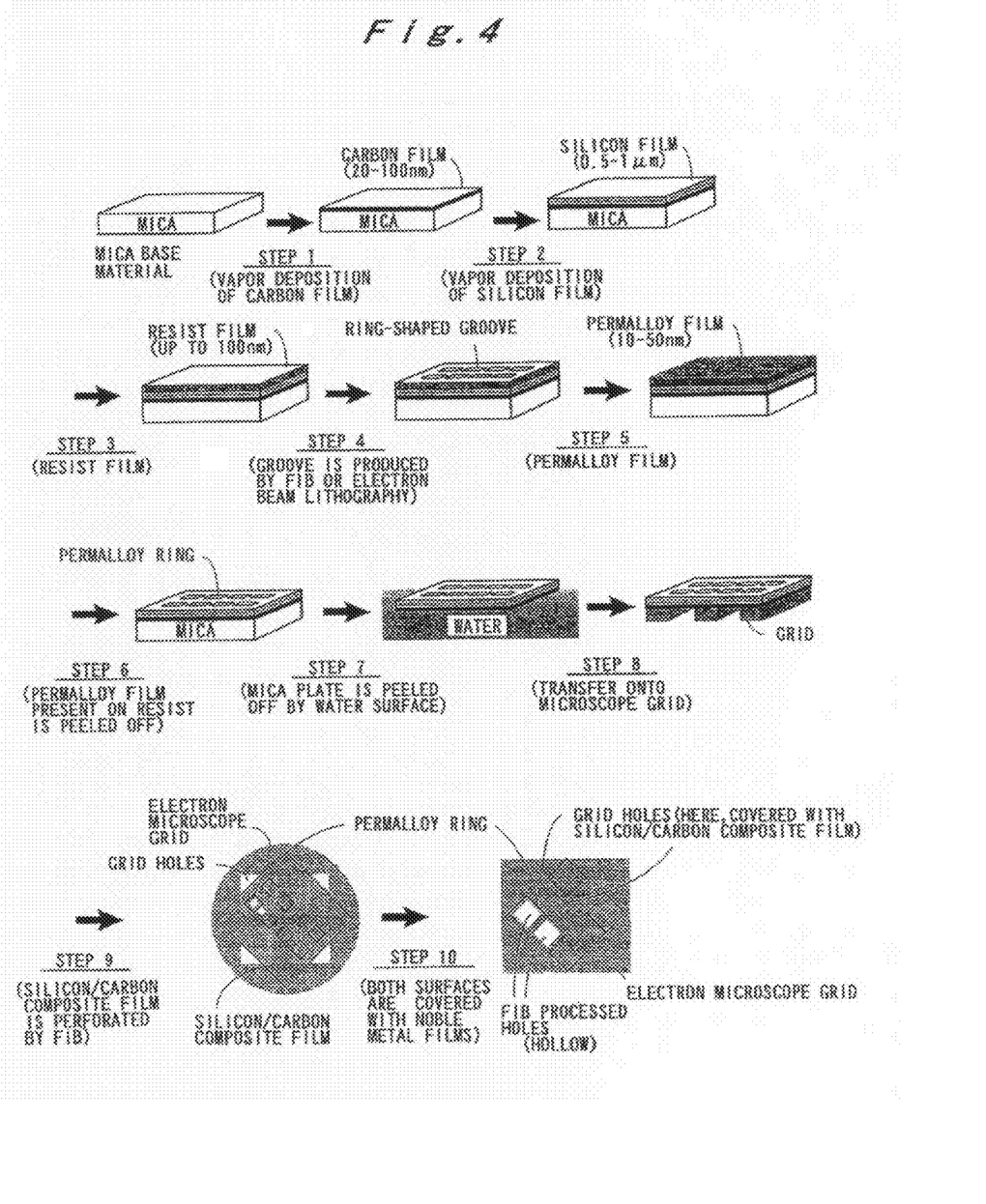
FIG. 4 illustrates an example of the method for manufacturing the phase plate of the present invention.

The first method will be described below with reference to FIG. 4. A mica plate is prepared and a carbon thin film and a silicon thin film are successively laminated on the mica plate (step 1, step 2). Then, a resist film is produced on the silicon thin film (step 3), a ring-shaped groove is cut in the resist film with a focused ion beam (FIB) or electron beam lithography (EB) so as to reach the silicon thin film (step 4). A magnetic thin film is then vapor deposited or sputtered thereon (step 5). Where the magnetic material placed on the resist is washed off (step 6), only a magnetic ring remains on the silicon thin film. The magnetic ring is stripped by water surface peeling from the mica plate between the mica and the carbon film (step 7) and picked up on an electron microscope grid having an aperture by a factor of 2-3 larger than the base material film of the magnetic ring (step 8). Because the relative position between the two is likely not to be determined, the probability of the magnetic ring getting on the opening of the electron microscope grid is about 50%. The magnetic ring that managed to get on the grid opening is supported by a support member composed of the silicon thin film-carbon thin film. Therefore, it is processed by using a focused ion beam (step 9). An opening through which the electron beam passes to the silicon thin film-carbon thin film is thus opened. A phase plate can thus be fabricated.

Figure 5:
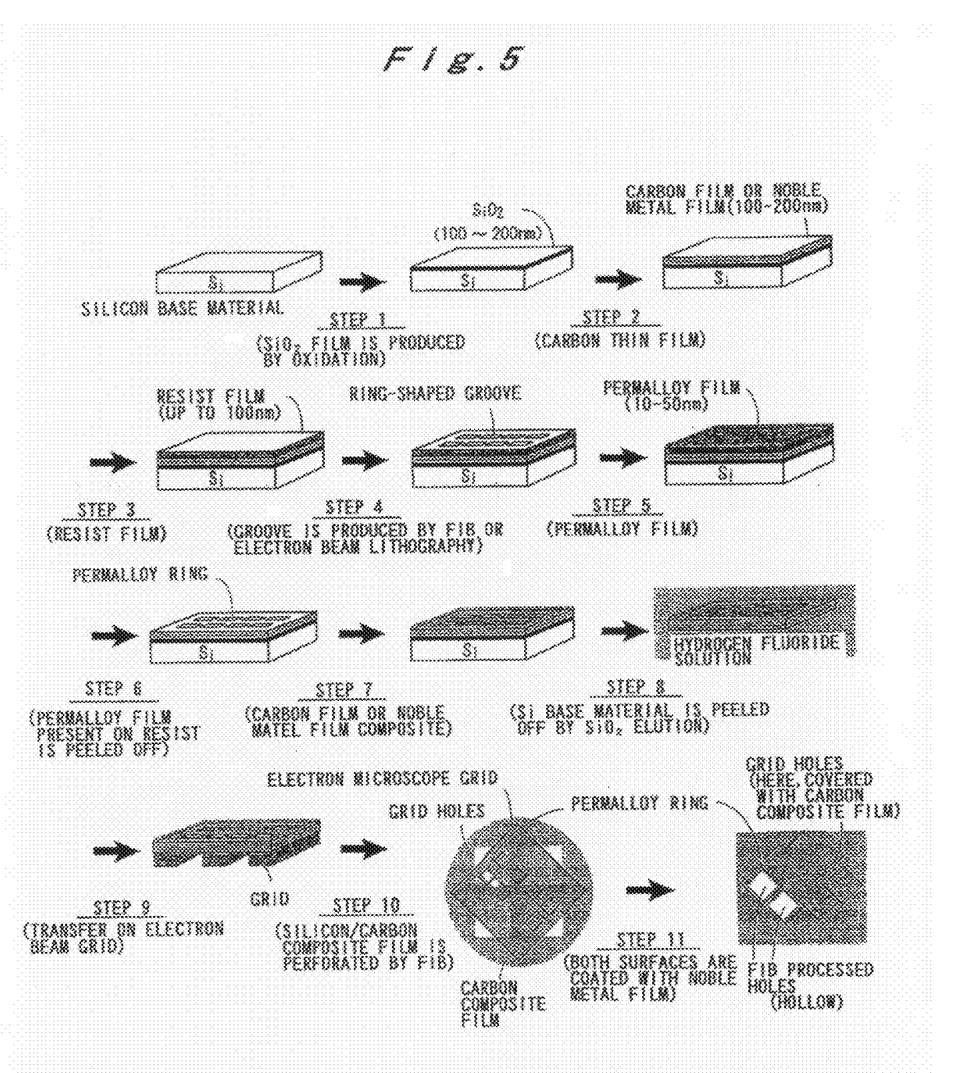
FIG. 5 illustrates another example of the method for manufacturing the phase plate of the present invention.

The second method will be described below with reference to FIG. 5. This method differs from the first method in that a silica thin film is formed on a silicon substrate, and a noble metal film or a carbon film is formed as a Permalloy support member thereon. In this case, peeling of the support member and silicon substrate is performed using a hydrogen fluoride solution. A silica layer is a layer of elution with the hydrogen fluoride solution. In this aspect, the process shown in FIG. 5 differs from that shown in FIG. 4. Other steps of the process are practically the same.

A method for processing and fabricating a magnetic thin-wire rod will be described below.

In the first method, first, a metal thin-wire having a diameter of 50 nm to 1 μm and a length of 10 to 1000 μm is prepared. The metal thin-wire can be, for example, from a material that is rigid and cannot be directly oxidized, such as platinum, gold, and stainless steel. The metal thin-wire is then caused to span the opening of a support member by performing the operation under a stereomicroscope using a micromanipulator. A material identical to that used in the phase plate based on the above-described magnetic thin-wire ring can be used as the support member. Both ends of the metal thin-wire on the side of the support member are then fixed to the support member. Such fixing can be performed using, for example, an electric welding method. Finally, a magnetic material with high coercivity is then vapor deposited, while controlling the thickness thereof, on the metal thin-wire having both ends thereof fixed, a magnetic thin film is formed, and a magnetic thin-wire rod is obtained. A ferromagnetic material such as cobalt, iron, and nickel can be used as the magnetic material with high coercivity.

A material employing a filamentary polymerized protein (microtube, or cilium or flagellum of bacteria) derived from a biological object is used as the base material. For example, a filamentary polymerized protein derived from a biological object and having a diameter of 10 nm to 1 μm is isolated. The isolation can be performed by the usually used method. Then, the isolated filamentary polymerized protein is reconfigured and adjusted by controlling a pH (acidity) ionic strength and temperature, and an aqueous solution sample containing the filamentary protein with a length of 10 to 1000 μm. Then, a drop of suspension of the filamentary polymerized protein is placed on a mesh-like support member having a large number of openings and sucked up with a filtration paper to produce a water flow. A low-temperature electron microscope is then used to confirm that the filamentary polymerized protein arranged in one direction by the flow spans the openings of the support. The support member confirmed to be spanned by the filamentary polymerized protein is then freeze dried. Those of a large number of spanned filamentary polymerized proteins that will not be used as a base for a magnetic thin-wire are removed by using a focus ion beam method. Finally, a magnetic material with high coercivity is vapor deposited on the support where the filamentary polymerized protein has been spanned and also on the filamentary polymerized protein, while controlling a thickness, to form a magnetic thin film and obtain a magnetic thin-wire rod. A ferromagnetic material such as cobalt, iron, and nickel can be used as the magnetic material with high coercivity.

With the third method, carbon nanotubes are used as a base material. For example, dispersible carbon nanotubes having a diameter of 10 nm to 1 μm and having dispersibility in water are prepared. Then, the isolated dispersible carbon nanotubes are adjusted and an aqueous solution containing dispersible carbon nanotubes with a length of 10 to 1000 μm is prepared. A drop of the aqueous solution containing dispersible carbon nanotubes is placed on a mesh-like support member having a large number of openings and sucked up with a filtration paper to produce a water flow. A microscope is then used to confirm that dispersible carbon nanotubes arranged in one direction by the flow span the openings of the support. The support with a large number of confirmed dispersible carbon nanotubes is dried. Those of a large number of spanned dispersible carbon nanotubes that will not be used as a base for a magnetic thin-wire are removed by using a focus ion beam method. A magnetic material with high coercivity is vapor deposited on the support where the dispersible carbon nanotubes have been spanned and also on the dispersible carbon nanotubes, while controlling a thickness, to form a magnetic thin film and obtain a magnetic thin-wire rod. A ferromagnetic material such as cobalt, iron, and nickel can be used as the magnetic material with high coercivity.

A processing example of a magnetic thin-wire rod and a test example of a phase plate using same will be described below in more detail.

Figure 6:
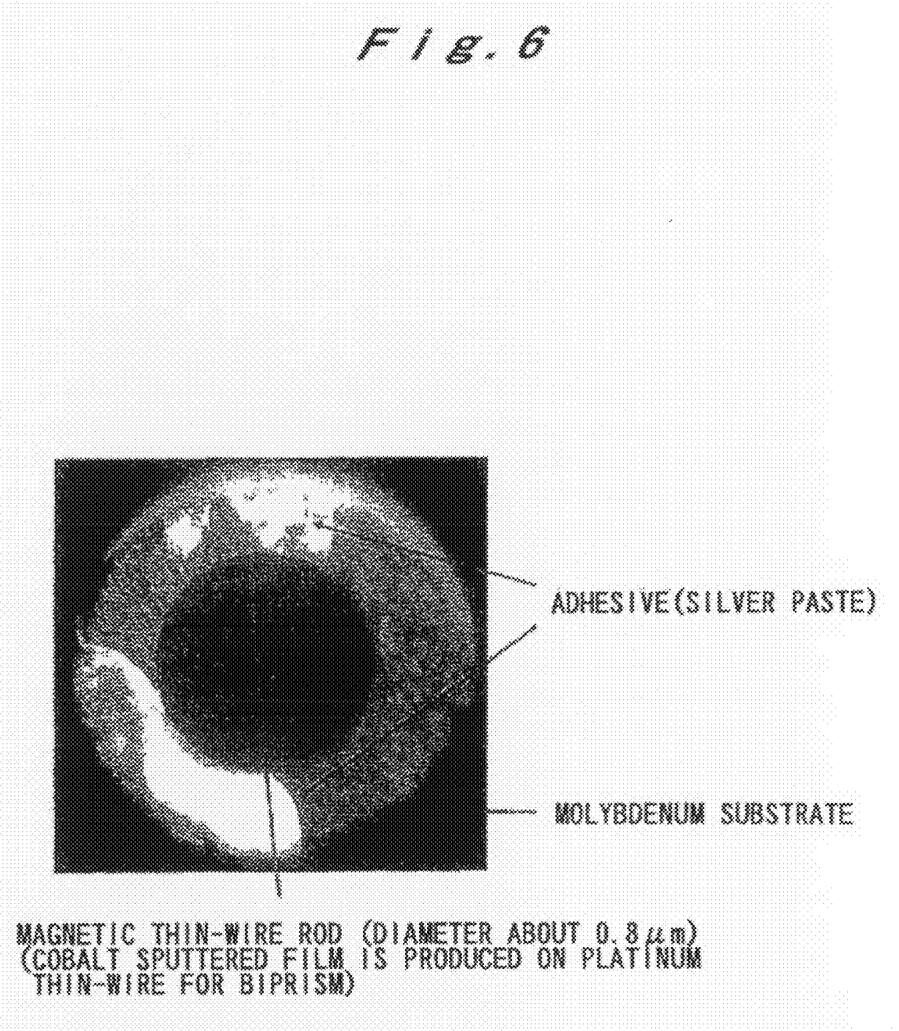
FIG. 6 illustrates a specific example of a magnetic thin-wire rod phase plate using a biprism.

The results obtained in processing the magnetic thin-wire rod are shown in FIG. 6. The magnetic thin-wire rod was fabricated by the following procedure.

i) A biprism for use in electron image holography is prepared.

ii) A pure cobalt film is produced (thickness about 10 nm) by a sputtering method on a platinum thin-wire with a diameter of 0.8 μm that spans an orifice of the biprism.

iii) The biprism vapor deposited with cobalt is covered on both sides with a carbon film (thickness about 10 nm) to prevent electric charging.

iv) The biprism is arranged in the center of a 4 Tesla solenoid magnet used in magnetic resonance imaging to convert cobalt into a permanent magnet with saturation magnetization, the arrangement being such that the magnet faces in the longitudinal direction.

v) The biprism is allowed to stay for 30 min and then removed and immediately disposed on the rear focal plane of an objective lens of a phase different electron microscope (120 kV) for testing.

In the presence of a strong external magnetic field, the magnetization direction of the permanent magnet is distorted. Further, in the usual electron microscope, the magnetic field on the rear focal plane of the objective lens is strong enough to distort the cobalt permanent magnet. Therefore, the test of the AB phase plate was conducted by using a special phase contrast electron microscope in which the magnetic field was shielded at the back focal plane (Hosokawa, Danev, Arai & Nagayama, J. Electr. Microsc. 54 (2005) 317).

The results of the performance test of the rod-shaped AB phase plate obtained with this test are shown below. Here, an example is shown in which a verification test of a loss-less Hilbert differential phase method was conducted by using a germanium thin film as a sample.

Figure 7:
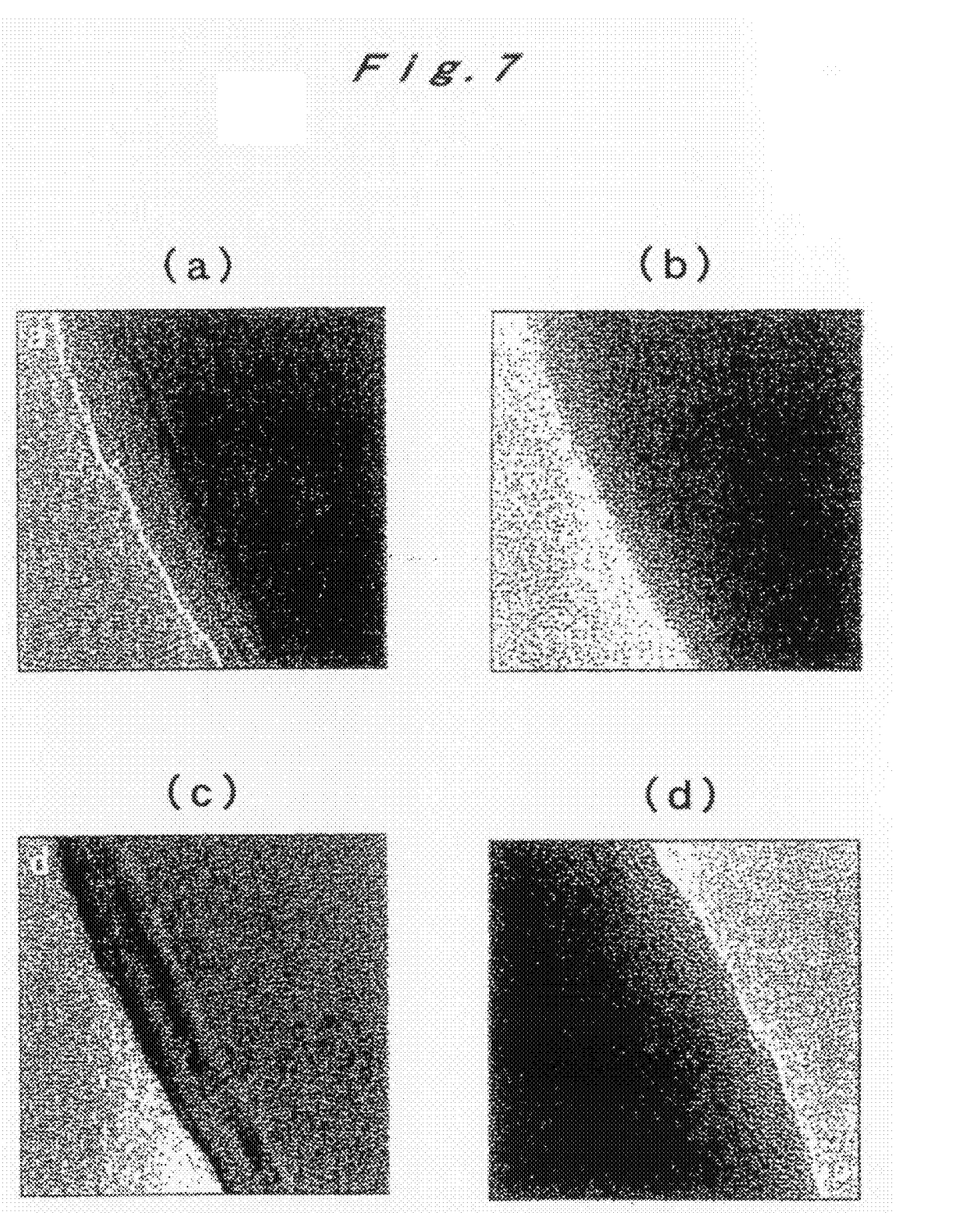
FIG. 7 illustrates a verification test example of the Hilbert differential phase contrast method using germanium as a sample.

FIG. 7 shows the results obtained by imaging the image of the edge portion of the germanium thin film. FIG. 7(a) shows a phase contrast image obtained by inserting a magnetic thin-wire rod phase plate composed of a permanent magnet. In this case, the central beam passes on the right side in the vicinity of the magnetic thin-wire rod. FIG. 7(b) shows the usual image (just focusing) obtained without inserting a phase plate. FIG. 7(c) shows the usual image (deep defocusing) without a phase plate. FIG. 7(d) shows a phase difference image obtained by inserting a thin-wire magnetic rod phase plate. In this case, the central beam passes on the left side in the vicinity of the magnetic thin-wire rod.

It is well known that in the usual image, the contrast is low in the just focus condition (FIG. 7(b)), and the contrast is high in the deep defocus condition (deep defocusing, FIG. 7(c)). On the other hand, in both phase contrast images (FIG. 7(a), (d): in the present test the phase difference on both sides of the magnetic thin-wire rod is not always adjusted to the correct π and, therefore, is apparently a sum of the Hilbert differential contrast image and the usual image), the so-called differential-type image (image similar to a topographic map onto which light falls from one direction) is observed that is specific in the Hilbert differential contrast image. However, depending on whether the central beam passes on the left or right side of the magnetic thin-wire rod, the differential orientation is reversed, and the direction in which the light falls is reversed from left to right or vise versa (FIG. 7(a), (d)). This is exactly the result demonstrating the phase contrast image that can be expected in accordance with the present invention (see R. Danev, H. Okawara, N. Usuda, K. Kametani & K. Nagayama, J. Biol. Phys. 28 (2002) 627-635) and it indicates that the vector potential of the magnetic thin-wire rod acts exactly as a Hilbert differential contrast phase plate.

Figure 8:
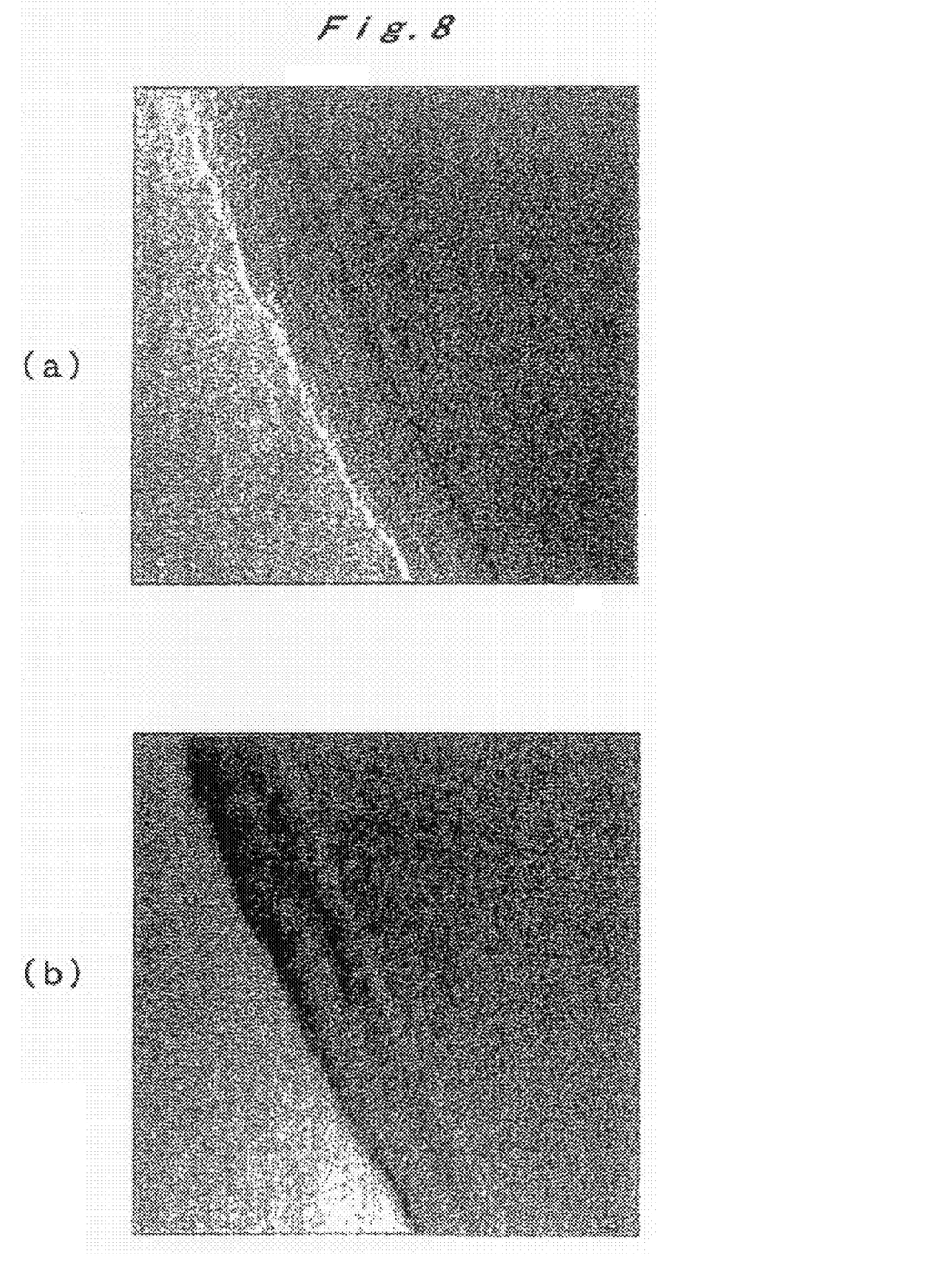
FIG. 8 illustrates an image that is a sum (b) of two images obtained when a central light is passed on the left and right sides of the magnetic thin-wire rod and an image that is a difference (a) thereof.

In the Hilbert differential contrast phase difference, as described above, two different phase difference images (FIG. 7(a), (d)) are provided when the central beam passes on the left and right sides of the magnetic thin-wire rod. Where these two images are used, the images with different properties are reproduced by the difference and sum thereof. In particular, in the difference image (FIG. 8(a)) only the linear differential terms of the phase amount reflecting the electron density of the sample germanium film is reflected.

Therefore, in FIG. 8(a), the region with a variation of film thickness in the edge portion of the thin film is accentuated. On the other hand, in the sum image (FIG. 8(b)), the linear term is canceled and the sum of the usual image resulting from the shift of the phase difference from π and the square of the differential value is reflected. The difference image (FIG. 8(a)) is especially valuable as a pure differential image that can be detected only by the Hilbert phase contrast method.

Further, whether the present phase contrast method yields the expected loss-less phase plate was quantitatively verified. A method (see FIG. 9) described in Table 6 of a publication (K. Nagayama, Adv. Imaging. Electr. Phys. 138 (2005) 69-145) was used as the quantitative verification method.

Figure 9:
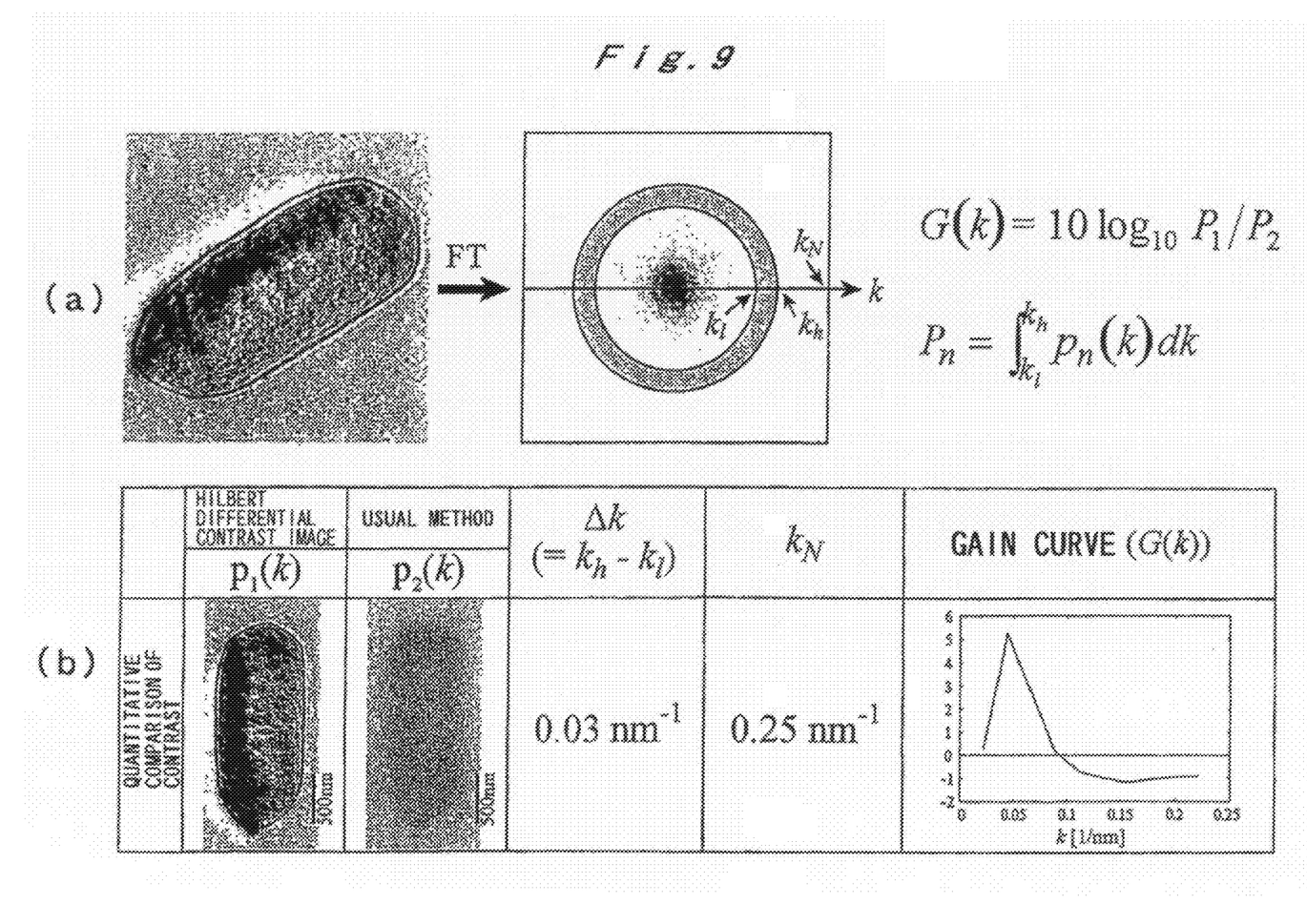
FIG. 9 is an explanatory drawing illustrating the frequency dependence of contrast of a cyano bacteria image obtained in the case of using a lossy phase plate (carbon film semicircular $\pi$ phase plate) and contrast comparison (Gain curve) of the usual method and an operation method based on such frequency dependence.

An example shown in FIG. 9 represents the performance verification example of the Hilbert differential contrast method for the case in which a phase plate with an electron beam loss was used. With such phase plate, an aperture inserted into a back focal plane of the objective lens was half covered with a carbon film (π phase plate for an accelerating voltage of 300 kV) with a thickness of about 60 nm (see FIG. 1(a)). In this case, loss occurs because the carbon film shields the electron beam to a certain degree, but even in this case, the recovery of the low-frequency component, which is the merit of the phase contrast method, is achieved. Therefore, the Hilbert differential contrast phase difference image has a contrast higher than that of the usual image, as demonstrated by the two images compared in FIG. 9(b). However, contrast deterioration caused by the electron beam loss appears in the high-frequency component. In order to observe this effect, the real image was Fourier transformed (FT) as shown in FIG. 9 (FIG. 9(a)) and intensity comparison was performed in a frequency space (G(k)[Gain curve] in FIG. 9(a)). In the gain curve, the intensity of the phase contrast image is, as expected, higher than that of the usual image at a low spatial frequency 0 to 0.1 nm$^{-1}$. On the other hand, at a high frequency of 0.1 nm$^{-1}$ or higher, the intensity of the phase contrast image is lower than that of the usual image.

Figure 10:
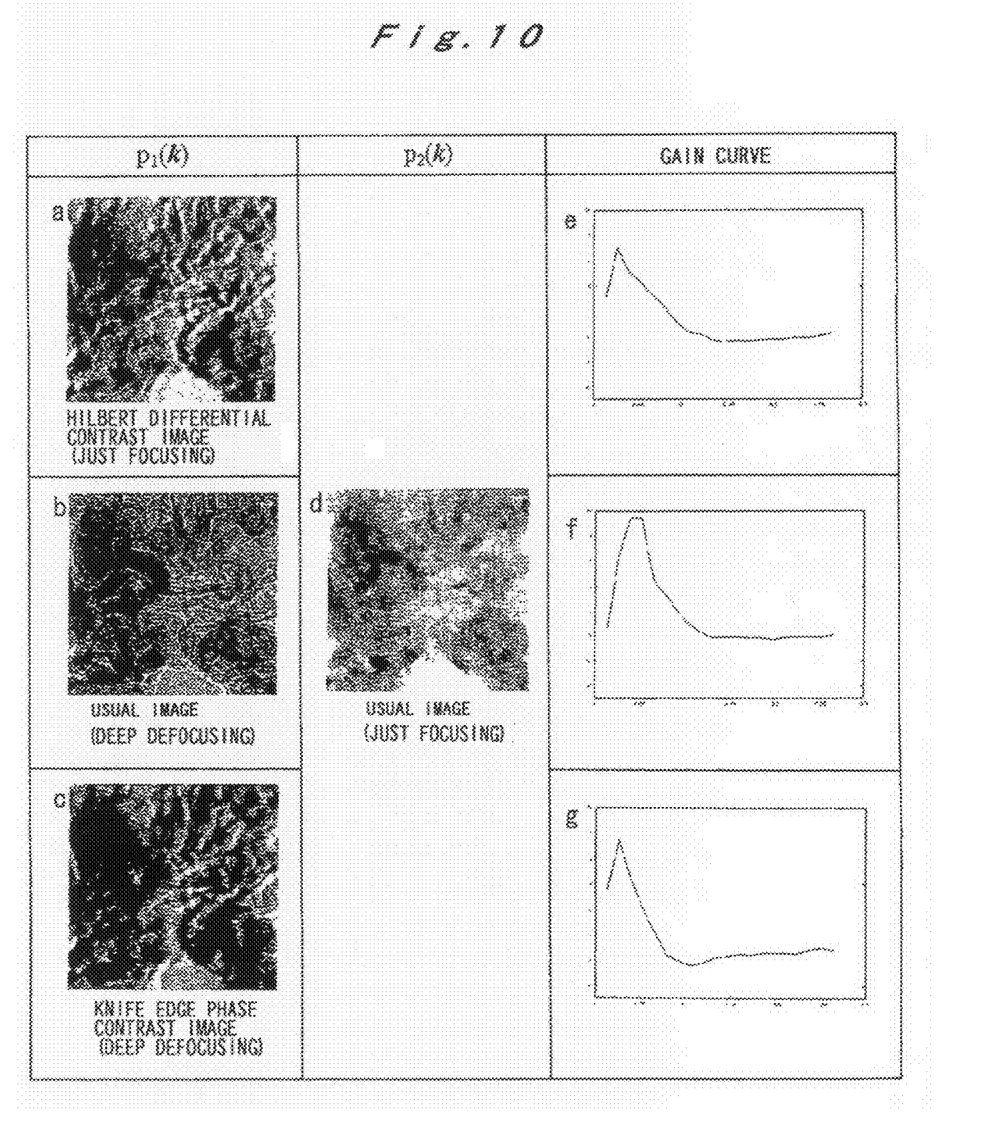
FIG. 10 illustrates results relating to a Gain curve showing the performance of the AB phase plate calculated based on the electron micrograph of graphite.

FIG. 10 illustrates the comparison of the phase contrast image and usual image of a graphite particle. FIG. 10(a) shows a Hilbert differential contrast image (just focusing), FIG. 10(b) shows the usual image (deep defocusing), FIG. 10(c) shows a phase contrast image obtained by a knife edge phase contrast method (a knife edge is introduced in half of the aperture and an electron beam is completely stopped therein, and a phase contrast method in which the carbon film shown in FIG. 1(a) is replaced with a knife edge), which is a simple phase contrast method that has been known for a long time, and FIG. 10(d) shows a usual image (just focusing). Among the four images (FIG. 10(a) to (d)), as expected, the usual image in the just focus condition (FIG. 10(d)) had the lowest contrast. The Hilbert differential contrast image (FIG. 10(a)) using the magnetic thin-wire rod phase plate had the highest contrast and the lowest image distortion. By using a deep defocusing, the contrast of the usual image can be also restored (FIG. 10(b)), but a low-frequency filter image inherent to deep defocusing is obtained.

The knife edge phase contrast image (FIG. 10(c)) shown for reference has an image contrast higher than that of the usual image of FIG. 10(d), but is darker as a whole. These properties of the images are quantitatively supported by the Gain curves shown on the right side (e)-(g) of FIG. 10. FIG. 10(e) compares the Hilbert differential contrast method and the usual method and has to be compared with the Gain curve shown in FIG. 9(b). Here, a specific feature is that the intensity loss is practically absent at a high frequency of 0.1 nm$^{-1}$ or higher. On the other hand, when the knife phase contrast image and the usual image compared (FIG. 10(g)), because the electron beam loss is further increased (half of the electron beam is completely cut off) with respect to that of the Hilbert differential contrast phase plate using a carbon film –2 Gain is obtained at a frequency higher than 0.07 $nm^{-1}$. The result is shifted to the negative side with respect to a Gain of –1 obtained for the carbon film phase plate shown in FIG. 9(a). In other words, the contrast is weaker.

In comparing the deep defocusing usual image and the just focusing usual image (FIG. 10(f)), because no phase plate is inserted, the Gain on the high-frequency side (higher than 0.13 $nm^{-1}$) is zero, that is, the images are equal to each other. On the other hand, the Gain on the low-frequency side is positive and makes contribution of contrast recovery (FIG. 10(f)). It has a meaning of contrast enhancement by the defocusing that has been used as the usual method. It seems that the deep defocusing method is superior to the Hilbert differential contrast method illustrated by FIG. 10(e), but this is apparently due to the fact that the phase difference of the magnetic thin-wire rod phase plate of the present case has not been accurately tuned to $\pi$. On closer investigation, the gain of the Hilbert differential method is better in the low-frequency side (0.015-0.03 $nm^{-1}$), and this is demonstrated as the difference in contrast observed in comparison in FIG. 10(a), (b).

As described above, the phase plate using a magnetic thin-wire rod from cobalt that is produced by ion sputtering on a biprism has been confirmed to demonstrate the expected loss-less property of an AB phase plate.

As described hereinabove, according to the present invention, a loss-less phase plate having a structure in which an aperture orifice is spanned by a magnetic thin-wire serving as a permanent magnet can be fabricated as a phase plate for use in a phase contrast electron microscope. A vector potential produced by the magnetic flux confined within the magnetic thin-wire does not depend on the accelerating voltage, and a constant phase difference is provided on the left and right sides of the thin-wire. Therefore, by setting the phase difference to $\pi$, it is possible to realize a phase contrast electron microscope for a Hilbert differential contrast method (similar to a differential interferometry method of an optical microscope, see Japanese Patent Application laid-open No. 2003-100249). The advantage of this process is that no object shields the electron beam, except the ultrathin magnetic thin-wire itself, thereby completely eliminating loss. Further, where the phase difference on the left and right side of the magnetic thin-wire is once set to $\pi$, it can be applied to any electron microscope, regardless of the accelerating voltage. Further, by adding a mechanism for maintaining the phase plate at a high temperature, it is possible to perform $\pi$ shift adjustment accurately. Moreover, the size of the magnetic thin-wire can be randomly adjusted according to experimental requirements. Further, in accordance with the present invention, by using these advantages, the Hilbert differential AB phase plate will realize a perfect Hilbert differential contrast electron microscope with no electric charge loss.

The invention claimed is:

1. A phase plate for an electron microscope, comprising:
a support member having an opening; and
a magnetic thin-wire ring or a magnetic thin-wire rod, a portion of the magnetic thin-wire ring or the magnetic thin-wire rod spanning the opening of the support member, so as to form a spanning portion having left and right sides,
wherein the magnetic thin-wire ring or the magnetic thin-wire rod generates a vector potential,
a phase difference is formed between electron beams that pass through the left and right sides of the spanning portion of the magnetic thin-wire ring or the magnetic thin-wire rod,
the phase difference between the electron beams that pass through the left and right sides of the spanning portion of the magnetic thin-wire is controlled to a specific value by adjusting a value of saturation magnetization of the magnetic thin-wire, and
the adjustment of the value of the saturation magnetization of the magnetic thin-wire is performed by temperature control.

2. The phase plate for an electron microscope according to claim 1, wherein the value of the phase difference is pi ($\pi$).

3. The phase plate for an electron microscope according to claim 1, wherein the magnetic thin-wire rod is made of a permanent magnet having high coercivity.

4. The phase plate for an electron microscope according to claim 1, wherein the support member is a nonmagnetic oxidation-resistant conductive thin film.

5. The phase plate for an electron microscope according to claim 4, wherein the nonmagnetic oxidation-resistant conductive thin film is a carbon thin film or a noble metal thin film.

* * * * *